United States Patent [19]
Larrabee et al.

[11] Patent Number: 5,485,080
[45] Date of Patent: Jan. 16, 1996

[54] NON-CONTACT MEASUREMENT OF LINEWIDTHS OF CONDUCTORS IN SEMICONDUCTOR DEVICE STRUCTURES

[75] Inventors: Robert D. Larrabee, Derwood; Jay F. Marchiando, Germantown, both of Md.

[73] Assignee: The United States of America as represented by the Secretary of Commerce, Washington, D.C.

[21] Appl. No.: 117,672

[22] Filed: Sep. 8, 1993

[51] Int. Cl.$^6$ ............................. G01R 31/00; G01R 27/00
[52] U.S. Cl. ...................... 324/158.1; 324/529; 324/716; 324/763
[58] Field of Search ................................. 324/158 R, 529, 324/158.1, 716, 719, 763

[56] References Cited

U.S. PATENT DOCUMENTS

| | | | |
|---|---|---|---|
| 2,291,533 | 7/1942 | Cummings | 324/529 |
| 3,974,443 | 8/1976 | Thomas | 324/64 |
| 3,992,663 | 11/1976 | Seddick | 324/529 |
| 4,074,188 | 2/1978 | Boatman et al. | 324/529 |
| 4,144,493 | 3/1979 | Lee et al. | 324/158 R |
| 4,516,071 | 5/1985 | Buehler | 324/158 |
| 4,833,396 | 5/1989 | Haberland | 324/73 |
| 4,956,611 | 9/1990 | Maltiel | 324/699 |
| 5,264,377 | 11/1993 | Chesire et al. | 324/158 R |

OTHER PUBLICATIONS

Cresswell et al, "Test Structure for the In-Plane Locations of Projected Features With Nanometer-Level Accuracy Traceable to a Coordinate Measurement System", Proceedings of 1993 IEEE International Conference on Microelectric Test Structures, Barcelona Spain, Mar. 1993.

*Primary Examiner*—Ernest F. Karlsen
*Attorney, Agent, or Firm*—Leydig Voit & Mayer

[57] ABSTRACT

A method of measuring the linewidth of an electrical conductor on a semiconductor substrate includes preparing mutually separated test and interconnection areas on a surface of a semiconductor substrate; forming an electrical interconnection conductor on the surface of the substrate in the interconnection area with a substantially uniform linewidth electrically interconnecting elements on the surface; simultaneously with forming the interconnection conductor, forming in the test area a test structure having a plurality of closed loops of the electrical conductor having the same linewidth as the interconnection conductor; measuring the impedance or complex reflection coefficient of the test structure using a head disposed opposite the test area, spaced from the surface, and coupled to the test structure without directly contacting the test structure; and correlating the measured impedance or complex reflection coefficient of the test structure with measurements of geometrically identical structures of conductors having known linewidths to determine the linewidth of the test structure and, thereby, the linewidth of the interconnection conductor.

17 Claims, 3 Drawing Sheets

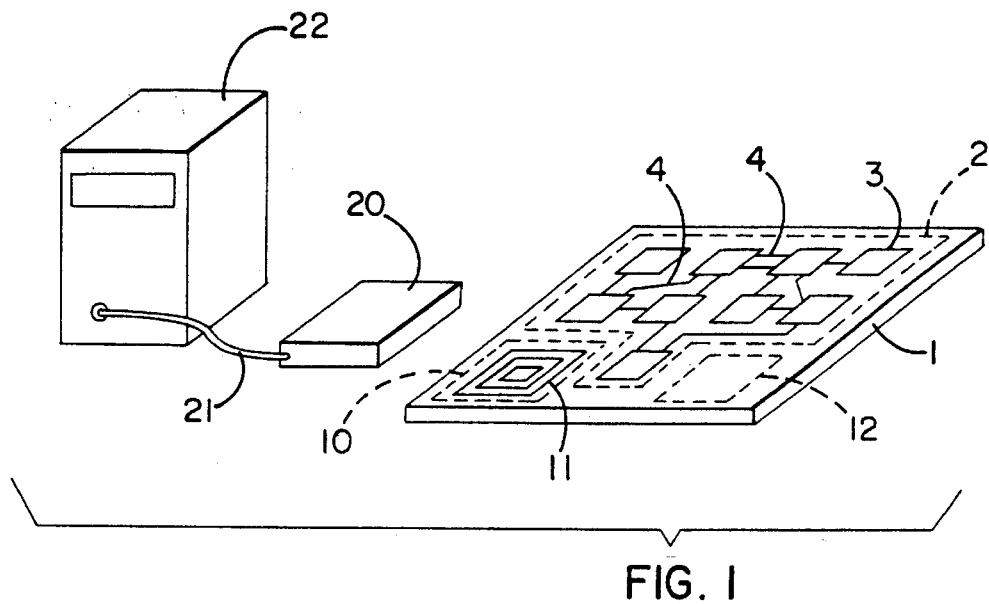
FIG. 1
FIG. 2
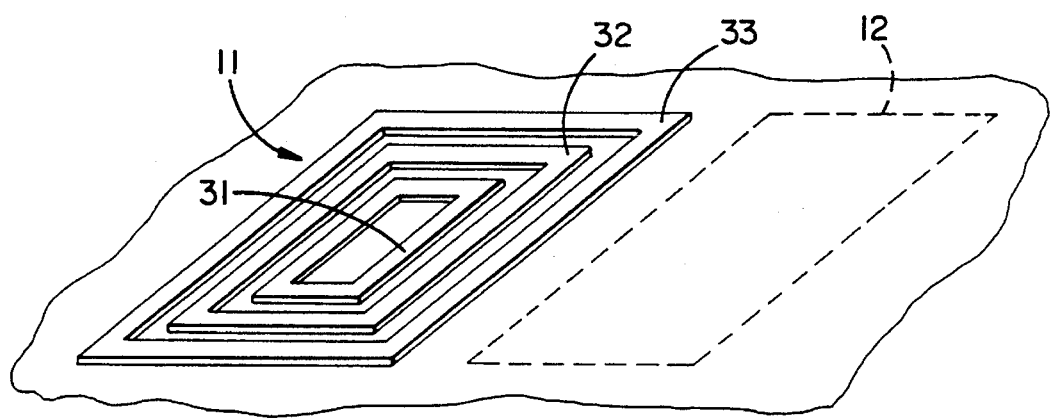

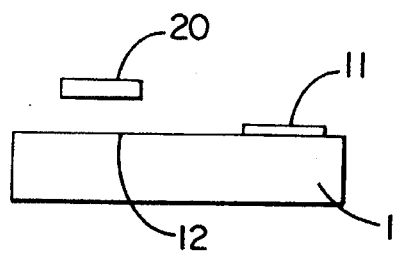
FIG. 3(a)
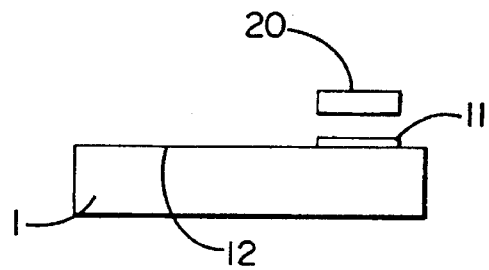
FIG. 3(b)
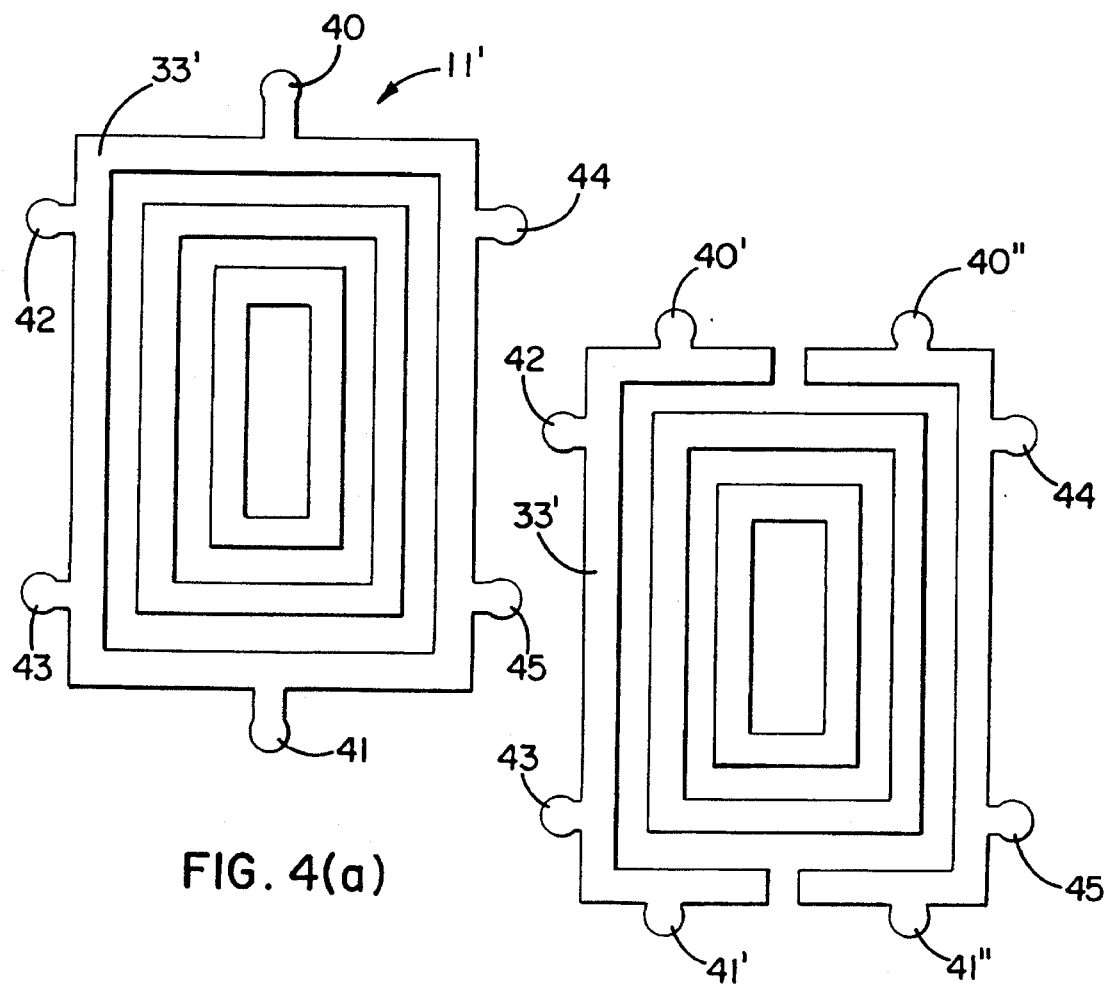
FIG. 4(a)
FIG. 4(b)

NON-CONTACT MEASUREMENT OF LINEWIDTHS OF CONDUCTORS IN SEMICONDUCTOR DEVICE STRUCTURES

FIELD OF THE INVENTION

The invention relates to precision measurement of micrometer and sub-micrometer linewidths of electrically conducting interconnection lines disposed on semiconductor substrates. The linewidth is measured without direct contact by using magnetic or electromagnetic coupling between a signal source and a test pattern of conductors having the same linewidth as the interconnection lines.

BACKGROUND OF THE INVENTION

The widths of electrical conductors, i.e., referred to as linewidths, on semiconductor substrates have been traditionally measured optically and/or with direct current (DC) probes. The optical measurement techniques have become increasingly difficult to use as linewidths have become smaller in integrated circuits. Expensive, complex optical apparatus is required for accurate measurement of micrometer and sub-micrometer linewidths.

Direct current techniques of linewidth measurement employ pointed electrical probes that make direct mechanical contact with probe pads electrically connected to interconnection lines having linewidths to be measured or to pads of a test structure having linewidths to be measured. Typically, a test structure is prepared at the same time interconnection lines are formed so that all lines of interest have the same width. Examples of techniques using patterns of conducting lines and electrical probes to determine the linewidths of conducting lines from measurements of current and voltage are described in U.S. Pat. Nos. 3,974,443 to Thomas, 4,516,071 to Buehler, and 4,956,611 to Maltiel. These electrical measurements of linewidths are subject to error, unless corrected, when linewidths become very narrow, i.e., in the micrometer to sub-micrometer range. Examples of test structures and appropriate correction techniques to account for very narrow linewidths measured electrically are described in Creswell et al , "Test Structure for the In-Plane Locations of Projected Features with Nanometer-Level Accuracy Traceable to a Coordinate Measurement System", 1993 IEEE International Conference on Microelectronic Test Structures, Barcelona.

An essential feature of conventional electrical measurement of linewidth is the direct mechanical contact between pointed electrical probes and pads extending from the lines having widths being measured. The probes are suspected of producing contamination when they contact and slide across probe pads in a linewidth test structure. Since cleanliness and the avoidance of contamination is a vital consideration in semiconductor device technology, it is desirable to avoid direct mechanical contact in measuring line widths.

Non-contact measurements of linewidths using capacitive coupling between a line or a line test structure and a capacitive probe have been suggested, but the capacitance required to achieve the coupling required for an accurate measurement is unreasonably large. Another non-contact method for measuring bulk resistivity of a conductive material that might be applied to measuring linewidths employs eddy currents. However, the amount of electrically conductive material present in the interconnection lines on a semiconductor substrate is too small for useful application of the eddy current method.

Although the known non-contact methods of measuring linewidths are not effective, it is still desirable to provide a method of measuring linewidths of interconnection lines on semiconductor substrates without direct mechanical contact with the electrical conductor of which the width is being measured.

SUMMARY OF THE INVENTION

In a method according to the invention for measuring the linewidth of an electrical conductor on a semiconductor substrate, mutually separated test and interconnection areas are prepared on the surface of the semiconductor substrate. Interconnection electrical conductors are formed on the surface of the substrate in the interconnection area having a linewidth and electrically interconnecting elements on the surface. Simultaneously with forming the interconnection conductors, a test structure having a plurality of closed loops of the electrical conductor having the same linewidth as the interconnection conductors is formed in the test structure area. The alternating current impedance of the test structure is measured using a coil disposed opposite the test area, spaced from the surface, and inductively coupled to the test structure without contacting the test structure. The measured impedance is correlated with measured impedances of geometrically identical test structures of conductors having known linewidths on the same kinds of semiconductor substrates to determine the linewidth of the conductor of the test structure and, thereby, the linewidth of the interconnection conductors. Alternatively, the complex reflection coefficient of the test structure is measured through a transmission line, such as a coaxial cable or waveguide, having an open end that is disposed proximate the test structure. The measured complex reflection coefficient is correlated with measured complex reflection coefficients of geometrically identical test structures having known linewidths to determine the linewidth of the test structure and, thereby, the linewidth of the interconnection conductors;

BRIEF DESCRIPTION OF THE DRAWINGS

FIG. 1 is a perspective view of a substrate including mutually separated reference, test, and interconnection areas and a schematic indication of a probe and impedance meter employed in a method according to the invention.

FIG. 2 is a perspective view of reference and test areas on a substrate.

FIGS. 3(a) and 3(b) are side views illustrating steps in a method according to the invention.

FIGS. 4(a) and 4(b) are plan views of alternative test structures.

In all of the figures, like elements are given the same reference numbers.

DETAILED DESCRIPTION OF PREFERRED EMBODIMENTS

Figure 5:
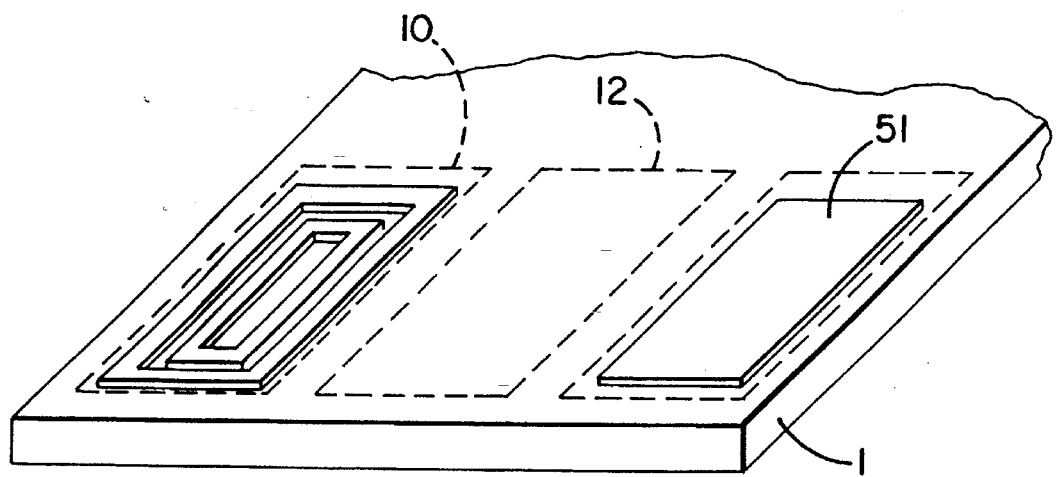
FIG. 5 is a perspective view of a part of a substrate including two test structures for use in a method according to the invention.

FIG. 1 includes a highly schematic perspective view of a semiconductor substrate 1. The semiconductor substrate includes various surface areas that are used for different purposes. An interconnection area 2 includes various electronic elements 3, such as transistors, resistors, and capacitors, that are connected together in a circuit. The electronic elements 3 are interconnected by interconnection conductors 4. The interconnection conductors 4 are typically formed in photolithographic processes involving the deposition and removal of metal. The interconnection conductors 4 are all simultaneously formed using a photolithographic mask. Although the interconnection conductors are typically metals, in some instances, doped polysilicon or other materials may be employed as the interconnection conductors 4.

A test area 10 on the surface of the semiconductor substrate 1 is reserved for a test structure 11. The test structure 11, which is described in more detail with respect to other figures, includes a plurality of closed loops of electrical conductors formed simultaneously with the interconnection conductors 4. The electrical conductors of those closed loops of the test structure are defined by the same mask defining the interconnection conductors 4 and are produced in the same processing in order to have substantially the same linewidth as the interconnection conductors 4, the linewidth of which is to be determined.

A reference area 12 is present in still another area of the surface of the substrate 1. That reference area 12 has no electronic elements 3 nor any interconnection conductors 4 or test structure in it. As illustrated in FIG. 1, the interconnection area 2, the test area 10, and the reference area 12 are all spaced and mutually isolated from each other.

In the invention, the linewidth of the conductors of the test structure 11 is determined without mechanical contact and, from that linewidth, the linewidths of the simultaneously formed interconnection conductors 4 is determined. The method is usable with substrates of any semiconductor material and the substrate 1 may be an elemental semiconductor material, such as silicon, or a compound semiconductor material, such as gallium arsenide. In some instances, an electrically insulating film (not shown in FIG. 1) may be present between the semiconductor substrate and the interconnection conductors 4 and the test structure 11. When the substrate 1 has a relatively high resistivity, for example, is semi-insulating gallium arsenide, an insulating film may be unnecessary.

As described below, in the novel method, the impedance or complex reflection coefficient of the test structure 11 is measured and compared to measured impedances or complex reflection coefficients of geometrically identical test structures with known, various linewidths on the same kind of substrates. Based upon that comparison, the linewidth of the interconnection conductors 4 is determined. The impedance of the test structure is measured inductively without direct mechanical contact between the test structure or any other element on the substrate 1 and a test head 20 shown in FIG. 1. When inductive coupling is employed, that head 20 is preferably a planar multiple turn coil that may be selectively positioned spaced from and opposite the test area 10 and the reference area 12 of the substrate 1. The test head 20 is connected by a conventional shielded transmission line 21, such as a coaxial cable, to a conventional impedance meter 22. The complex impedance of the head 20 alone and in combination with the test structure area and reference area of the substrate can be determined from a digital display on the impedance meter 22. Typically, the impedance measurement is made with a continuous signal having a frequency within the range of 1 to 10 MHz.

FIG. 2 is a close-up view of another arrangement of a test area 10 and a reference area 12. In FIG. 2, those two areas are arranged relatively close to each other, yet are spaced apart from each other. The illustrated embodiment of the test structure 11 includes three commonly centered closed loops 31, 32, and 33. This test structure 11 is only illustrative of numerous test structure configurations that can be employed in a method according to the invention. An important feature of a test structure is that it includes multiple closed, i.e., continuous, loops. While it might be preferable for the test structure to include serially connected multiple turns, as in the preferred embodiment of the test head 20, it is difficult to prepare a multiple turn coil on the surface of the substrate 1. A connection to at least one of the coil ends would require a via hole or another electrically conducting structure penetrating the substrate or an air bridge. In order to avoid the complications associated with such a complex structure that would increase the cost of preparing for and using the invention, it is preferred that the test structure include a plurality of closed loops that are electrically isolated from each other, as illustrated in FIG. 2. The loops may be circular, elliptical, or any convenient shape and are not restricted to the rectangular shape of FIG. 2.

FIGS. 3(a) and 3(b) illustrate steps in one embodiment of the novel method. In this embodiment, the head 20 is first placed a desired distance from the surface of the substrate opposite the reference area 12. It is important in carrying out the inventive method that a reproducible spacing between the surface of the substrate 1 and the head 20 be achieved. That spacing is important to ensure that the impedance measurements at the test area are correctly compared with impedance measurements made under the same conditions with calibrated test structures, i.e., test structures that have known linewidths. One preferred technique for establishing the desired spacing between the surface of the substrate 1 and the test head 20 is a measurement of the impedance of the substrate at the reference area. When the test head is energized, the impedance of the test head opposite the reference area of the substrate 1 is measured. That impedance is sensitive to and varies with the spacing between the head 20 and the surface of the substrate 1.

In obtaining the calibration data necessary to convert an impedance measured at a test structure into linewidth, a calibration substrate of the same composition as the substrate with a measuring test structure is used. The calibration substrate includes a plurality of test structures geometrically identical to the test structures with unknown linewidths but with respective conductors having known linewidths. The linewidths are uniform in each calibration test structure but vary from test structure to test structure. The spacing between the calibration substrate and the head 20 is determined as desired. At that spacing, the impedance indicated by the impedance meter 22 is recorded both for a reference area and for the test area including the test structure. When a sample, such as the substrate 1 in FIG. 3(a), is measured, the head 20 is disposed opposite the reference area 12 and the spacing of the head from he surface of the substrate 1 is adjusted until the impedance measured at the reference area of the calibration substrate is obtained. Essentially, the impedance is a measure of the headsubstrate spacing that is used to establish the desired spacing with a test substrate.

With that desired spacing established, the substrate 1 and/or the head 20 are moved laterally relative to each other, as illustrated in FIG. 3(b), until the head 20 is aligned with and opposite the test structure 11. Then, the impedance measured by the meter 22 is again recorded. That measured impedance is compared to measurements with similar test structures on identical substrates with a variety of linewidths measured by other means, as described below. From those calibrated linewidth versus impedance data, the linewidth of the conductors of the test structure 11 is determined and, thereby, the linewidth of the interconnection conductor is determined. The method of adjusting the spacing between the head 20 and the substrate 1 using impedance measurements as described above is not exclusive. If carriers for the head 20 and the substrate 1 can repeatedly reproduce the positioning of the head relative to the surface of the substrate with a desired accuracy, position adjustments based on impedance measurements are not necessary.

A modified test structure 11' is illustrated in FIG. 4(a). In that modified test structure, the outermost rectangular loop 33' includes current terminals 40 and 41 extending from the transverse sides of that loop. A pair of voltage terminals 42 and 43 extend from one of the lateral sides of the loop and a second pair of voltage terminals 44 and 45 extend from the opposite lateral side of the outer-loop 33'. This type of test structure may also be employed for providing calibration data. The same inductively coupled impedance measurements are made with this test structure 11' as described above. The linewidth is also determined electrically using methods such as those described in the patents to Thomas, Buehler, and Maltiel and the article by Creswell, all described above. The spacing between the pairs of voltage terminals is determined by a non-electrical method, such as by optical measurement. An electrical current is conducted between current terminals 40 and 41 and the potentials are measured between the pairs of voltage terminals. From that information and the resistivity and thickness of the material comprising the outer loop 33', the linewidth of the conductor can be mathematically determined. When the linewidths are narrow, the correction techniques described in the article by Creswell and the publications referenced by the Creswell article are employed to ensure that linewidths are accurately determined.

Still another form of a test structure 11" that may be employed in preparing calibrated impedance versus linewidth data is shown in FIG. 4(b). Fundamentally, that test structure 11" is identical to the test structure 11 except that the outermost loop 33' is divided into two parts. The division may be made after the impedance measurement is completed. The division ensures that the current flowing between current terminals 40' and 41' as well as the current flowing between terminals 40" and 41" is well known, increasing the accuracy of the measurement.

In the test structure 11', two current paths are available between current terminals 40 and 41. If the outer loop 33' is not perfectly symmetrical with respect to those current terminals, unequal currents may flow in the two parts of the loop to produce the voltage differences observed across voltage terminal pairs 42 and 43 and 44 and 45, potentially causing errors in the linewidth determinations. As an alternative test structure, only a single division in the outermost loop 33' needs to be made, for example, between current terminals 40' and 40". Those two current terminals are then used for conducting a single current flow through the open loop 33' for measurement of voltage differences and calculation of linewidths. Alternatively, the linewidths may be measured optically to confirm an inductively measured linewidth or to produce calibrated data.

There are numerous alternatives to the arrangements described above within the scope of the invention. For example, if mechanical apparatus is available for ensuring accurate positioning of the test head 20 with respect to a test structure 11, use of a reference area to adjust the position of the head 20 with respect to the surface of the substrate 1 is unnecessary. If that step can be eliminated, the part of the surface of the substrate devoted to the reference area can be utilized as an active area for electrical and electronic circuitry. In addition, if a specified positioning can be reproduced, calibration standards, i.e., impedance versus linewidth data can be produced by a standards laboratory and used elsewhere without the need of producing calibration data at each measurement site.

The novel method may also be employed in a van der Pauw measurement to determine sheet resistivity. As shown in FIG. 5, in addition to the test and reference areas 10 and 12, a sheet resistivity area 51 is also provided on the surface of the substrate 1. With that area, a sheet 51 of the electrically conductive material forming the electrical conductors is deposited continuously over a fixed size area, illustrated as a rectangular area in FIG. 5. The same inductively-coupled impedance measurements made between the head 20 and the test structure 11 are made with the head 20 and sheet 51 and compared with previously made, calibrated measurements. From that comparison, the sheet resistivity of the sheet 51 is determined. If the dimensions of that sheet 51, including its area and thickness, are known and the conductor is assumed to be homogeneous, then the bulk resistivity of the material can be easily determined. That characteristic is useful in calculating or confirming linewidth, particularly when a test structure, such as test structure 11', is employed with mechanical contacts establishing electrical connections to confirm linewidth measurements or to produce calibrated data for use with other linewidth measurements.

In the impedance measurements, a conventional impedance meter is employed of course, it is important that the same impedance measurement technique be employed in producing the calibration data as in measurements intended to determine unknown linewidths. The impedance may be measured with a steady state frequency or the impedance meter 22 may employ electrical pulses or step function signals to determine impedance from the amplitude and phase of signals reflected from the head 20.

Although the foregoing discussion has focused on measuring impedances using a coil and inductive coupling, an analogous method can be employed using microwave frequencies and measuring complex reflection coefficients. In this method, the signal coupling between the head 20 and the test structure is electromagnetic, not magnetic. In that arrangement, the head 20 is an open-ended transmission line, such as a coaxial cable or a waveguide, brought into proximity with test structures and calibrated test structures without direct contact. The complex reflection coefficient of the test structure is measured and compared to measured complex reflection coefficients for calibrated geometrically identical test structures having conductors with known linewidths, thereby determining the linewidth of interconnection conductors. Most preferably, in this embodiment the test structure includes electrically conducting lines parallel to the electrical field lines of a signal propagating in the transmission line. When the transmission line is a waveguide, the test structure includes parallel lines. When the transmission line is a coaxial cable, the test structure includes radial lines.

Figure 6:
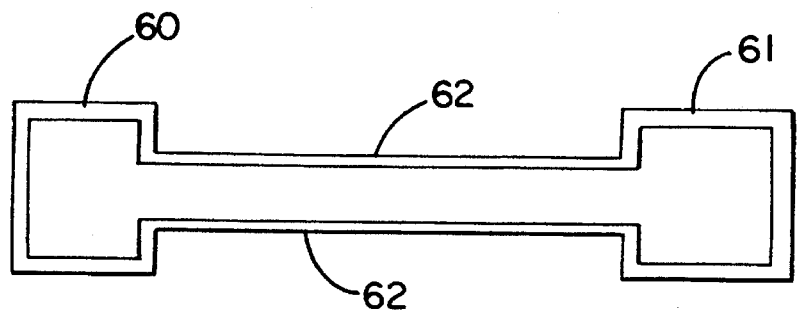
FIG. 6 is a plan view of an alternative test structure.

Still another technique for measuring linewidth inductively is illustrated in FIG. 6. There, first and second closed loops 60 and 61 are disposed on the surface of the semiconductor substrate 1. Those loops are relatively widely separated from each other and have linewidths that are much larger than the linewidth to be determined. Electrical conductors 62 having the linewidth desired to be measured extend between and are connected to each of the loops 60 and 61, forming a closed current path. In this arrangement, a primary coil like the test head 20 is placed opposite the loop 60 and a similar coil is placed opposite the loop 61. Signals are applied to the first head, inducing an electrical response in the loop 60 that is conducted through the conductor 62, connecting the loop 60 to the loop 61. The signal thus conducted is sensed by the second head which is disposed opposite the loop 61. Based upon the frequency response and other characteristics of the signal at the secondary, i.e., receiving, head opposite the loop 61, the linewidth of the conductor 62 is determined.

The invention has been described with respect to certain preferred embodiments. However, various additions and modifications within the spirit of the invention will occur to those of skill in the art. Accordingly, the scope of the invention is limited solely by the following claims.

We claim:

1. A method of measuring the linewidth of an electrical conductor on a semiconductor substrate comprising:

preparing mutually separated test and interconnection areas on a surface of a semiconductor substrate;

forming an electrical interconnection conductor on the surface of the substrate in the interconnection area having a linewidth and electrically interconnecting elements on the surface;

simultaneously with forming the interconnection conductor, forming in the test area a test structure having a plurality of mutually electrically isolated closed loops of the electrical conductor having the same linewidth as the interconnection conductor;

measuring the impedance of the test structure using a coil disposed opposite the test area, spaced from the surface, and inductively coupled to the test structure without contacting the test structure; and correlating the measured impedance of the test structure with impedance measurements of geometrically identical structures of conductors having known linewidths to determine the linewidth of the test structure and, thereby, the linewidth of the interconnection conductor.

2. The method of claim 1 including preparing a reference area on the surface of the substrate mutually separated from the interconnection area and test area and free of the electrical conductor including, while measuring the impedance of the substrate with the coil opposite the reference area and spaced from the surface, adjusting the spacing between the surface and the coil to obtain a specified measured impedance, thereby establishing a desired spacing between the coil and the surface.

3. The method of claim 2 including, while maintaining the desired distance between the coil and the surface of the substrate and before measuring the impedance of the test structure, moving the substrate relative to the coil to a position opposite the test structure.

4. The method of claim 1 including forming a test structure including a plurality of non-intersecting loops having a common center.

5. The method of claim 4 including forming the loops in a rectangular shape.

6. The method of claim 1 wherein the coil includes multiple turns connected in series and generally arranged in a plane.

7. The method of claim 1 including calibrating the linewidth of a test structure by conducting a current through at least part of one of the closed loops between current terminals extending from the loop and measuring the resulting voltage across two voltage terminals extending from the loop and separated from each other by a known distance.

8. The method of claim 1 including calibrating the linewidth of a test structure by optically measuring the linewidth.

9. A method of measuring the linewidth of an electrical conductor on a semiconductor substrate comprising:

preparing mutually separated test and interconnection areas on a surface of a semiconductor substrate;

forming an electrical interconnection conductor on the surface of the substrate in the interconnection area having a linewidth and electrically interconnecting elements on the surface;

simultaneously with forming the interconnection conductor, forming in the test area a test structure having a plurality of closed loops of the electrical conductor having the same linewidth as the interconnection conductor;

measuring the complex reflection coefficient of the test structure using a transmission line disposed opposite the test area, spaced from the surface, and electromagnetically coupled to the test structure without contacting the test structure; and correlating the measured complex reflection coefficient of the test structure with complex reflection coefficient measurements of geometrically identical structures of conductors having known linewidths to determine the linewidth of the test structure and, thereby, the linewidth of the interconnection conductor.

10. The method of claim 9 including preparing a reference area on the surface of the substrate mutually separated from the interconnection area and test area and free of the electrical conductor including, while measuring the complex reflection coefficient of the substrate with the transmission line opposite the reference area and spaced from the surface, adjusting the spacing between the surface and the transmission line to obtain a specified measured complex reflection coefficient, thereby establishing a desired spacing between the transmission line and the surface.

11. The method of claim 10 including, while maintaining the desired distance between the transmission line and the surface of the substrate and before measuring the complex reflection coefficient of the test structure, moving the substrate relative to the transmission line to a position opposite the test structure.

12. The method of claim 9 including forming a test structure including a plurality of non-intersecting loops having a common center.

13. The method of claim 12 including forming the loops in a rectangular shape.

14. The method of claim 9 including calibrating the linewidth of a test structure by conducting a current through at least part of one of the closed loops between current terminals extending from the loop and measuring the resulting voltage across two voltage terminals extending from the loop and separated from each other by a known distance.

15. The method of claim 9 including calibrating the linewidth of a test structure by optically measuring the line width.

16. The method of claim 9 wherein the transmission line is a coaxial cable including forming the test structure to include radially disposed electrically conducting lines parallel to electric field lines produced by a signal propagating in the coaxial cable.

17. The method of claim 9 wherein the transmission line is a waveguide including forming the test structure to include electrically conducting lines parallel to electric field lines produced by a signal propagating in the waveguide.

* * * * *